(12) United States Patent
Lee

(10) Patent No.: US 10,627,459 B2
(45) Date of Patent: Apr. 21, 2020

(54) ANISOTROPIC MAGNETO-RESISTIVE (AMR) ANGLE SENSOR DIE COMPRISING A PLURALITY OF AMR ANGLE SENSORS

(71) Applicant: TEXAS INSTRUMENTS INCORPORATED, Dallas, TX (US)

(72) Inventor: Dok Won Lee, Mountain View, CA (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 15/651,206

(22) Filed: Jul. 17, 2017

(65) Prior Publication Data

US 2019/0018082 A1    Jan. 17, 2019

(51) Int. Cl.
| | |
|---|---|
| *G01R 33/09* | (2006.01) |
| *G01D 5/16* | (2006.01) |
| *G01B 7/30* | (2006.01) |
| *G01D 5/14* | (2006.01) |
| *G01B 7/00* | (2006.01) |
| *G01R 33/00* | (2006.01) |

(52) U.S. Cl.
CPC ............ *G01R 33/096* (2013.01); *G01B 7/003* (2013.01); *G01B 7/30* (2013.01); *G01D 5/145* (2013.01); *G01D 5/16* (2013.01); *G01R 33/0052* (2013.01)

(58) Field of Classification Search
CPC .... G01R 33/096; G01R 33/0052; G01D 5/16; G01D 5/145; G01B 7/30
USPC ........ 324/219–252, 200, 207.2–207.24, 500, 324/529–530, 750.12, 750.21, 754.17, 324/754.29; 73/514.31, 514.39, 520.01, 73/779, 862.193, 862.333; 365/157–158, 365/170–173, 225.5; 438/73, 3
See application file for complete search history.

(56) References Cited

U.S. PATENT DOCUMENTS

| | | |
|---|---|---|
| 6,633,462 B2 | 10/2003 | Adelerhof |
| 7,312,609 B2 | 12/2007 | Schmollngruber |
| 2010/0050731 A1* | 3/2010 | Granig .................. G01D 5/145 73/1.11 |
| 2012/0153937 A1 | 6/2012 | Pozzati |
| 2015/0022191 A1 | 1/2015 | Ausserlechner |
| 2015/0354999 A1* | 12/2015 | Ausserlechner ..... G01D 11/305 73/866.5 |

* cited by examiner

*Primary Examiner* — Melissa J Koval
*Assistant Examiner* — Trung Nguyen
(74) *Attorney, Agent, or Firm* — Rose Alyssa Keagy; Charles A. Brill; Frank D. Cimino

(57) ABSTRACT

Some embodiments are directed to an anisotropic magneto-resistive (AMR) angle sensor die. The die comprises a plurality of AMR angle sensors, each of the plurality of AMR angle sensors comprising a first Wheatstone bridge and a second Wheatstone bridge, wherein an angle position output of the sensor die includes a combination of angle position outputs of each of the plurality of AMR angle sensors.

20 Claims, 8 Drawing Sheets

… (US 10,627,459 B2)

ANISOTROPIC MAGNETO-RESISTIVE (AMR) ANGLE SENSOR DIE COMPRISING A PLURALITY OF AMR ANGLE SENSORS

BACKGROUND

Anisotropic magneto-resistive material changes the value of its electrical resistance in response to a change in an externally applied magnetic field—for example, in response to a change in direction of the externally applied magnetic field. Anisotropic magneto-resistive (AMR) angle sensors exploit this property to develop an indication of angular position such as angular position of a shaft. In a typical embodiment, an AMR sensor is disposed in a fixed location, a magnet is attached to a rotating shaft proximate to the AMR sensor, and the AMR sensor develops an indication of the angular position of the shaft in response to changing orientation of the magnetic field produced by the rotating magnet.

SUMMARY

In an embodiment, an anisotropic magneto-resistive (AMR) angle sensor die is disclosed. The AMR angle sensor die comprises a plurality of AMR angle sensors, each of the plurality of AMR angle sensors comprising a first Wheatstone bridge and a second Wheatstone bridge, wherein an angle position output of the sensor die includes a combination of angle position outputs of each of the plurality of AMR angle sensors.

In another embodiment, an anisotropic magneto-resistive (AMR) angle sensor package is disclosed. The AMR angle sensor package comprises a sensor die comprising a plurality of AMR angle sensors, each of the plurality of AMR angle sensors comprising a first Wheatstone bridge and a second Wheatstone bridge disposed in a same plane and disposed in an octagonal pattern, wherein an angle position output of the sensor die includes a combination of angle position outputs of each of the AMR angle sensors.

In yet another embodiment, an anisotropic magneto-resistive (AMR) angle sensor package is disclosed. The AMR sensor package comprises a sensor die comprising four AMR angle sensors, where each of the four AMR angle sensors comprises a first Wheatstone bridge and a second Wheatstone bridge, wherein an angle position output of the sensor die is a combination of angle position outputs of each of the four AMR angle sensors, and an analog front end (AFE) electrically coupled to the sensor die that is configured to provide electrical power and ground to each of the four AMR angle sensors and to provide signal conditioning to the angle position output of the sensor die.

These and other features will be more clearly understood from the following detailed description taken in conjunction with the accompanying drawings and claims.

BRIEF DESCRIPTION OF THE DRAWINGS

For a more complete understanding of the present disclosure, reference is now made to the following brief description, taken in connection with the accompanying drawings and detailed description, wherein like reference numerals represent like parts.

DETAILED DESCRIPTION

Figure 1:
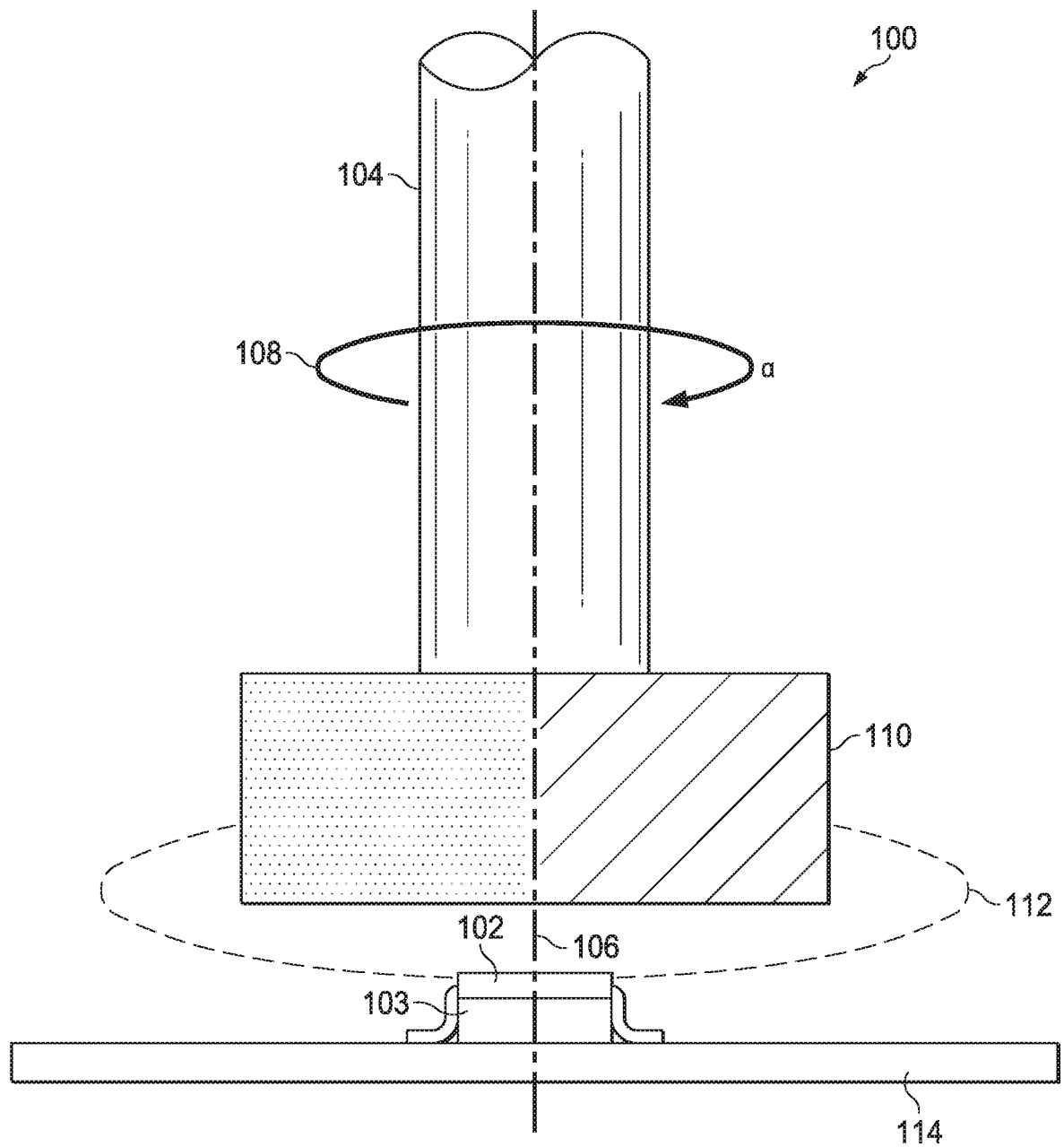
FIG. 1 is a side view illustrating a rotating shaft and an angular rotation sensor according to an embodiment of the disclosure.

Although illustrative implementations of one or more embodiments are illustrated below, the disclosed systems and methods may be implemented using any number of techniques, whether currently known or not yet in existence. The disclosure should in no way be limited to the illustrative implementations, drawings, and techniques illustrated below, but may be modified within the scope of the appended claims along with their full scope of equivalents.

Anisotropic magneto-resistive (AMR) angle sensors may be able to resolve angular displacement to a high degree of accuracy, for example to about ±0.1 degree. As used herein, the term 'about' may be constructed to mean within 5% of the stated value, unless otherwise characterized at the point of use. In some implementations and operating environments, however, this optimal accuracy may be decreased by interference from stray magnetic fields, for example in an engine compartment of an automobile. Stray magnetic fields may be generated by transient electrical currents such as high amperage electrical currents to operate electrical motors and/or solenoids. Recently, industry standards bodies have recommended new standards of immunity to stray magnetism for angle sensors. For example, ISO 11452-8: 2015 has recommended that angle sensors experience less than 0.1 degree of loss of accuracy due to an up to 4 mT stray magnetic field.

The present disclosure teaches an AMR angle sensor package implementation that features a plurality of AMR sensors on one die, also referred to as an AMR sensor array, where the angle outputs of each AMR angle sensor are coupled together to reduce the susceptibility to the stray magnetic field. The AMR sensor array is used in combination with a magnet generating a plurality of orthogonal in-plane magnetic fields. Thus, with an AMR angle sensor array featuring two AMR sensors on the die, a magnet producing two in-plane orthogonal magnetic fields is coupled to the rotating shaft whose angular displacement is being sensed. With an AMR angle sensor array featuring four AMR sensors on the die, a magnet producing four in-plane orthogonal magnetic fields is coupled to the rotating shaft whose angular displacement is being sensed. In an embodiment, the AMR sensor array die may be coupled to a single analog front end (AFE) that provides electrical ground and electrical power to the AMR sensor array die and conditions the angle output(s) developed by the AMR sensor array die (i.e., a plurality of AMR sensors on a single die need not be supported by a plurality of AFEs—a single AFE can service the AMR sensor array die).

As used herein, the phrase 'in-plane magnetic field' refers to the portion of the magnetic field emanated by a magnet that is incident upon the AMR sensor array die and is aligned to be about parallel (e.g., within ±5 degrees of parallel) to the plane of the AMR sensor array die. As used herein, the phrase 'in-plane orthogonal magnetic field' refers to the in-plane portions of magnetic fields where the in-plane magnetic field has different portions. For example, in an embodiment having four AMR sensors, the term 'in-plane orthogonal magnetic fields' means there are four distinct in-plane magnetic fields emanated from magnets aligned parallel to the plane of the AMR sensors and each of the four distinct in-plane magnetic fields is oriented to the remaining three in-plane magnetic fields at about +90 degrees, −90 degrees, or ±180 degrees.

Turning now to FIG. 1, an illustrative system 100 is described. In an embodiment, the system 100 comprises an anisotropic magneto-resistive (AMR) angle sensor array 102, an optional analog front end (AFE) 103, a shaft 104 having axis of rotation 106 and an angular displacement a 108, and a magnet 110 generating a magnetic field 112. In some contexts the AMR angle sensor array 102 may be referred to as an AMR angle sensor array die, because the AMR angle sensor array 102 may be implemented on a semiconductor substrate along with a plurality of other like AMR angle sensor arrays and then each of the sensor arrays cut apart as separate dies (singular being a 'die'). In an embodiment, the AMR sensor array 102 and the optional AFE 103 are coupled to a fixed structure 114, and the shaft 104 is free to rotate about axis 106. In an embodiment, the shaft may be a steering wheel, a crank shaft, a shaft of an aircraft control surface, or other rotating shaft.

The plane of rotation of the magnet 110 is about orthogonal to the axis of rotation 106 (e.g., the axis or rotation is within ±5 degrees of 90 degrees to the plane of rotation of the magnet). The plane of rotation of the magnet 110 is about parallel to a plane of the AMR sensor array 102 (e.g., substantially parallel to a plane of two Wheatstone bridges integral with the AMR sensor array 102, as discussed further hereinafter). The magnetic field 112 generated by the magnet 110 is substantially parallel to the plane of the AMR sensor 102 where it interacts with the AMR sensor array 102. As the magnet 110 rotates (responsive to the shaft 104 rotating), the direction of the magnetic field 112 relative to the plane of the AMR sensor array 102 ranges through ±360 degrees. The shaft 104 may rotate through multiples of ±360 degrees of angular displacement. It is further understood that the magnetic field 112 generated by the magnet 110 comprises a plurality of in-plane orthogonal magnetic fields. The magnet 110 of the system 100 is selected to match to the plurality of AMR sensors that compose the AMR sensor array 102.

Thus, an AMR sensor array 102 comprising two AMR sensors would be matched to a magnet 110 that generates two in-plane orthogonal magnetic fields, and an AMR sensor array 102 comprising four AMR sensors would be matched to a magnet 110 that generates four in-plane orthogonal magnetic fields.

Figure 2:
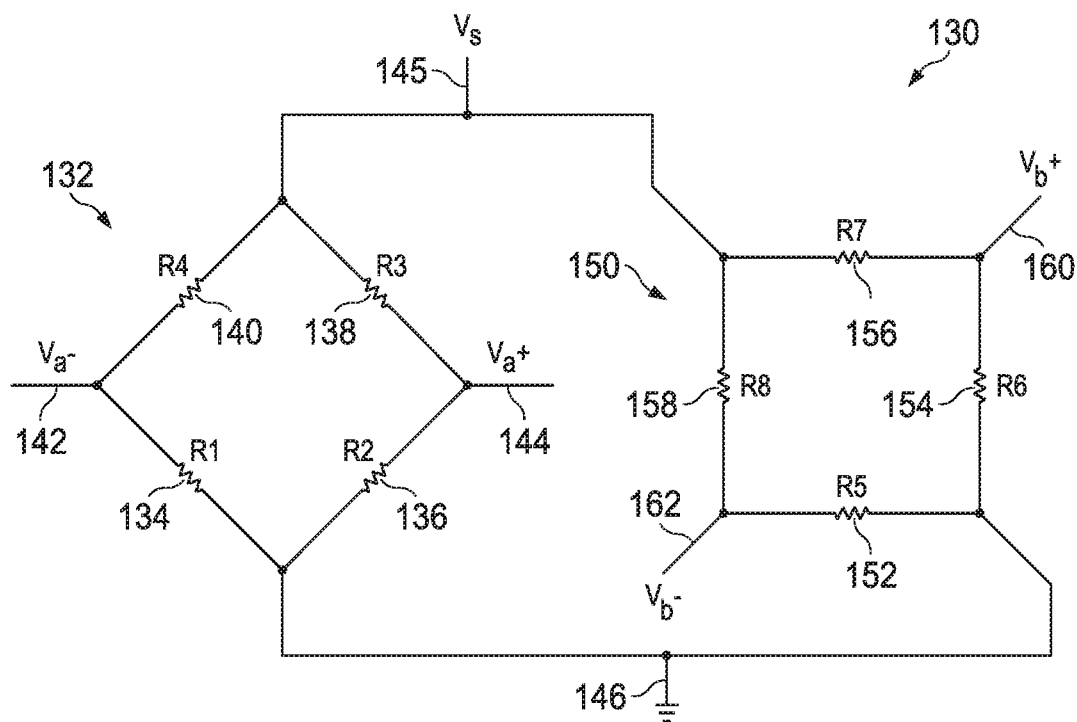
FIG. 2 is an electrical schematic of a pair of Wheatstone bridges according to an embodiment of the disclosure.

Turning now to FIG. 2, an illustrative circuit 130 is described. In an embodiment, the circuit 130 comprises a first Wheatstone bridge 132 and a second Wheatstone bridge 150. The first Wheatstone bridge 132 comprises a first resistor 134, a second resistor 136, a third resistor 138, and a fourth resistor 140. The first resistor 134 and the second resistor 136 are connected to an electrical ground 146 at one end. The third resistor 138 and the fourth resistor 140 are connected to an electrical power source 145 at one end. The first resistor 134 and the fourth resistor 140 are connected to a Va− reference point 142. The second resistor 136 and the third resistor 138 are connected to a Va+ reference point 144. The second Wheatstone bridge 150 comprises a fifth resistor 152, a sixth resistor 154, a seventh resistor 156, and an eighth resistor 158. The fifth resistor 152 and the sixth resistor 154 are connected to the electrical ground 146 at one end. The seventh resistor 156 and the eighth resistor 158 are connected to the electrical power source 145 at one end. The fifth resistor 152 and the eighth resistor 158 are connected to a Vb− reference point 162 at one end. The sixth resistor 154 and the seventh resistor 156 are connected to a Vb+ reference point 160 at one end.

The eight resistors 134, 136, 138, 140, 152, 154, 156, 158 may comprise anisotropic magneto-resistive material, and their resistance values may change as a direction of an external magnetic field changes. For example, the resistors 134, 136, 138, 140, 152, 154, 156, 158 may comprise ferromagnetic materials and alloys. The resistors may comprise nickel, iron, an alloy of nickel and iron, permalloy (i.e., an alloy of nickel-iron comprising about 80% nickel and about 20% iron), mu-metal (i.e., an alloy of nickel-iron comprising about 77% nickel, about 16% iron, about 5% copper, and about 2% chromium or molybdenum), or other ferromagnetic materials and alloys.

In an embodiment, the circuit 130, which may be referred to in some contexts as a pair of Wheatstone bridges, forms a component of the AMR angle sensor array 102, i.e., one of a plurality of AMR angle sensors that compose the array of AMR sensors. While the circuit 130 is illustrated schematically in FIG. 2 and does not represent a physical layout, the resistors of the bridges 132, 150 may be disposed in substantially the same plane (i.e., the Wheatstone bridges 132, 150 may be said to be disposed in the same plane). Additionally, the relative angle positions of the resistors illustrated in FIG. 2 may be maintained in a physical realization (e.g., when embodied in the AMR angle sensor 102), which may be better seen in FIG. 4 discussed hereinafter.

In operation, a voltage Vs may be applied as an electrical power source 145, for example a DC voltage. In some conditions, each Wheatstone bridge 132, 150 is balanced, although not necessarily at the same time (e.g., when one bridge is balanced, the other bridge may not be balanced). In a balanced condition of the first Wheatstone bridge 132, the voltage difference between Va+ reference point 144 and Va− reference point 142 is zero. In a balanced condition of the second Wheatstone bridge 150, the voltage difference between Vb+ reference point 160 and Vb− reference point 162 is zero. As the generated magnetic field 112 interacts with the circuit 130, however, the resistances change. Because the physical orientation of the resistors is different, the interaction of the generated magnetic field 112 with the circuit 130 affects different resistors differently, thereby unbalancing one or both of the Wheatstone bridges 132, 150. The unbalancing of one or both of the Wheatstone bridges 132, 150 thereby causes a non-zero (either a positive or a negative) voltage difference between reference points 142, 144 and/or between the reference points 160, 162. These one or more voltage differences can be processed to determine an angular displacement of the magnet 110 and hence of the shaft 104.

Figure 3:
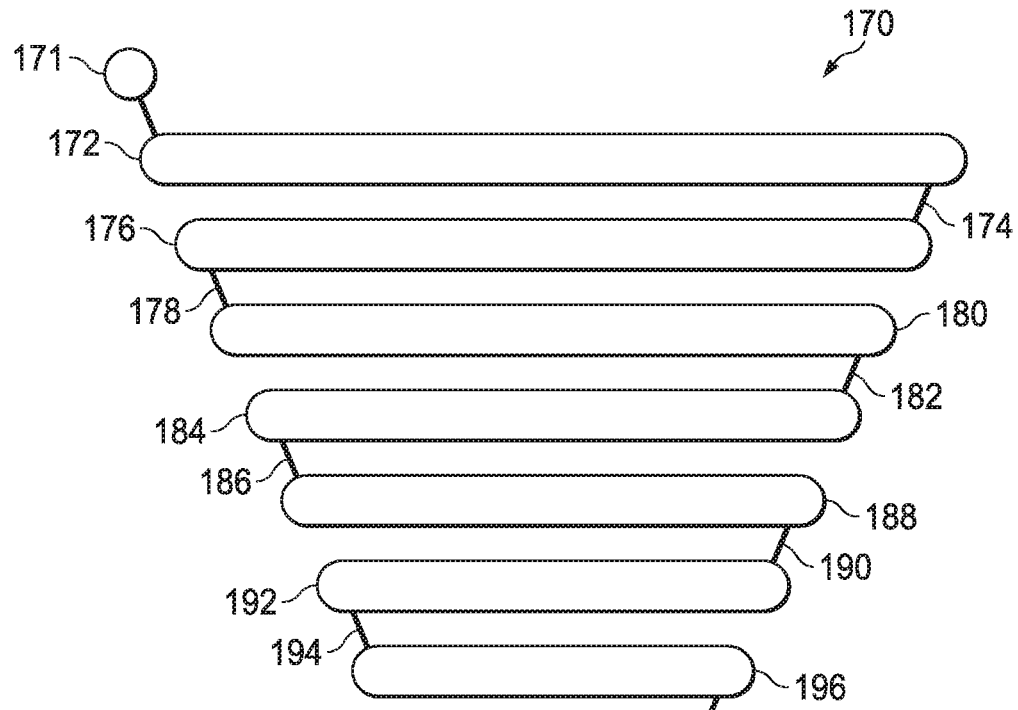
FIG. 3 is a top view illustrating a serpentine resistor according to an embodiment of the disclosure.

Turning now to FIG. 3, an illustrative serpentine resistor 170 is described. The serpentine resistor 170 may be said to have a generally trapezoidal shape or a "keystone" shape and to be generally flat or planar (i.e., a thickness of the serpentine resistor 170 relative to a breadth of the serpentine resistor 170 may have a ratio of 1:10 or less). The serpentine resistor 170 has a first electrical contact 171 at one end and a second electrical contact 190 at an opposite end. The serpentine resistor 170 is comprised of a plurality of strips of anisotropic magneto-resistive material, for example material that is deposited as a layer then etched in a semiconductor manufacturing process step. The strips of the serpentine resistor 170 comprise anisotropic magneto-resistive material, such as ferromagnetic materials and alloys. The strips may comprise nickel, iron, an alloy of nickel and iron, permalloy (i.e., an alloy of nickel-iron comprising about 80% nickel and about 20% iron), mu-metal (i.e., an alloy of nickel-iron comprising about 77% nickel, about 16% iron, about 5% copper, and about 2% chromium or molybdenum), or other ferromagnetic materials and alloys.

The ends of the strips are electrically connected by metal. As illustrated, the serpentine resistor 170 comprises seven strips of anisotropic magneto-resistive material: a first strip 172, a second strip 176, a third strip 180, a fourth strip 184, a fifth strip 188, a sixth strip 192, and a seventh strip 196. The serpentine resistor 170 may comprise any number of interconnected strips of anisotropic magneto-resistive material, either more than seven strips or fewer than seven strips. The first strip 172 is connected to the first electrical contact 171 at one end and to a first metal conductor 174 at another end. The second strip 176 is connected to the first metal conductor 174 at one end and to a second metal conductor 178 at another end. The third strip 180 is connected to the second metal conductor 178 at one end and to a third metal conductor 182 at another end. The fourth strip 184 is connected to the third metal conductor 182 at one end and to a fourth metal conductor 186 at another end. The fifth strip 188 is connected to the fourth metal conductor 186 at one end and to a fifth metal conductor 190 at another end. The sixth strip 192 is connected to the fifth metal conductor 190 at one end and to a sixth metal conductor 194 at another end. The seventh strip 196 is connected to the sixth metal conductor 194 at one end and to the second electrical contact 198 at another end. In this way, the serpentine resistor 170 is composed of a plurality of parallel strips of anisotropic magneto-resistive material. The resistance of the serpentine resistor 170 is the sum of the resistances of the parallel strips 172, 176, 180, 184, 199, 192, and 196. The resistances of the metal conductors 174, 178, 182, 186, 190, and 194 contribute negligible resistance to the serpentine resistor 170.

Figure 4:
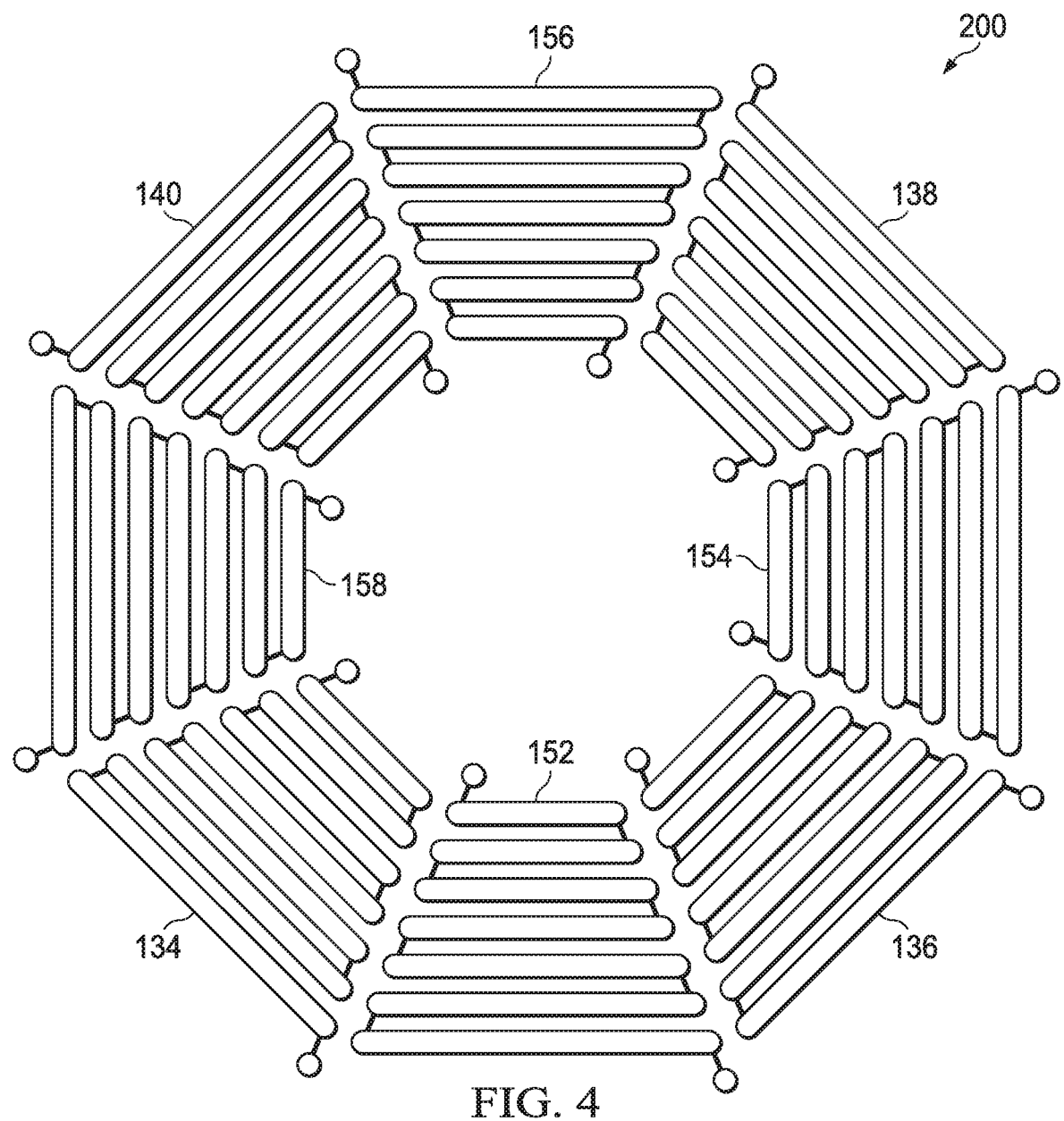
FIG. 4 is a top view illustrating eight serpentine resistors disposed in an octagonal arrangement according to an embodiment of the disclosure.

Turning to FIG. 4, an illustrative octagonal disposition of serpentine resistors 200 is described. Each of the serpentine resistors may be similar to the serpentine resistor 170 described above with reference to FIG. 3. By connecting the serpentine resistors appropriately, the circuit 130 of FIG. 2 may be established, i.e., a single AMR sensor can be formed. Said in other words, the Wheatstone bridges 132, 150 of circuit 130 of FIG. 2 may be said to be disposed in an octagonal pattern. By building a plurality of the octagonal dispositions of serpentine resistors 200 on a single die, the AMR sensor array 102 may be constructed.

The octagonal disposition of serpentine resistors 200 may be comprised of the first resistor 134, the second resistor 136, the third resistor 138, and the fourth resistor 140 connected to establish the first Wheatstone bridge 132 and the fifth resistor 152, the sixth resistor 154, the seventh resistor 156, and the eighth resistor 158 connected to establish the second Wheatstone bridge 150. The resistors 134, 136, 138, 140, 152, 154, 156, 158 may be manufactured using a semiconductor manufacturing process by depositing anisotropic magneto-resistive material on a substantially flat surface, such as on a dielectric or insulating layer, and then etching to electrically isolate the strips of the resistors from each other.

Each of the resistors 134, 136, 138, 140, 152, 154, 156, 158 may be aligned 45 degrees differently, either in a positive sense or a negative sense, to the adjacent resistors. The strips of the first resistor 134 and the third resistor 138 are parallel to each other and orthogonal to the strips of the second resistor 136 and the fourth resistor 140 which are parallel to each other. The strips of the fifth resistor 152 and the seventh resistor 156 are parallel to each other and orthogonal to the strips of the sixth resistor 154 and the eighth resistor 158 which are parallel to each other. The resistors 134, 136, 138, 140, 152, 154, 156, and 158 are located in substantially the same plane.

Figure 5:
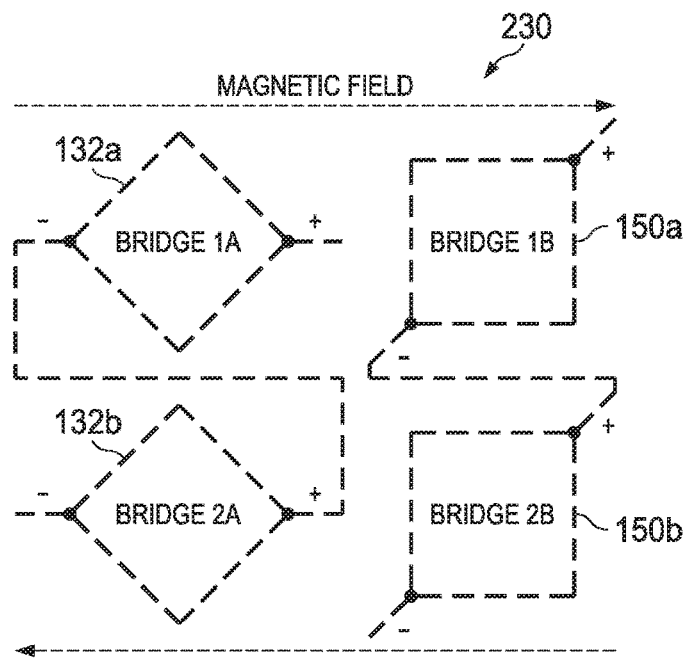
FIG. 5 is an electrical schematic of two anisotropic magneto-resistive (AMR) angle sensors exposed to two magnetic fields according to an embodiment of the disclosure.

Turning now to FIG. 5, an illustrative AMR angle sensor array 230 is described. The AMR angle sensor array 230 comprises two separate AMR angle sensors. A first AMR angle sensor comprises a first Wheatstone bridge 132a and a second Wheatstone bridge 150a. The bridges 132a, 150a may be implemented in a structure like that of the octagonal disposition of serpentine resistors 200 described above with reference to FIG. 4. The resistors of the first Wheatstone bridge 132a and the second Wheatstone bridge 150a may be connected to establish the circuit 130 of FIG. 2 described above. A second AMR angle sensor comprises a third Wheatstone bridge 132b and a fourth Wheatstone bridge 150b. The bridges 132b, 150b may be implemented in a structure substantially like that of the octagonal disposition of serpentine resistors 200 described above with reference to FIG. 4. The resistors of the third Wheatstone bridge 132b and the fourth Wheatstone bridge 150b may be connected to establish the circuit 130 of FIG. 2 described above. The first Wheatstone bridge 132a and the third Wheatstone bridge 132b can be connected in series with each other, and the second Wheatstone bridge 150a and the fourth Wheatstone bridge 150b can be connected in series with each other.

The angular displacement a 108, with reference to FIG. 1, can be found as $$V_A \propto (V_{1A+} - V_{1A-}) + (V_{2A+} - V_{2A-}) = V_{1A} + V_{2A} \quad \text{EQ 1}$$

$$V_B \propto (V_{1B+} - V_{1B-}) + (V_{2B+} - V_{2B-}) = V_{1B} + V_{2B} \quad \text{EQ 2}$$

$$\alpha = \frac{1}{2}\tan^{-1}\left(\frac{V_A}{V_B}\right) + \theta \quad \text{EQ 3}$$

where $V_{1A+}$ is the voltage of the first Wheatstone bridge 132a that corresponds to the Va+ reference point 142 of the first Wheatstone bridge 132 with reference to FIG. 2, $V_{1A-}$ is the voltage of the first Wheatstone bridge 132a that corresponds to the Va− reference point 144 of the first Wheatstone bridge 132 with reference to FIG. 2, $V_{1B+}$ is the voltage of the second Wheatstone bridge 150a that corresponds to the Vb+ reference point 160 of the second Wheatstone bridge 150 with reference to FIG. 2, $V_{1B-}$ is the voltage of the second Wheatstone bridge 150a that corresponds to the Vb− reference point 162 of the second Wheatstone bridge 150 with reference to FIG. 2, $V_{2A+}$ is the voltage of the third Wheatstone bridge 132b that corresponds to the Va+ reference point 142 of the first Wheatstone bridge 132 with reference to FIG. 2, $V_{2A-}$ is the voltage of the third Wheatstone bridge 132b that corresponds to the Va− reference point 144 of the first Wheatstone bridge 132 with reference to FIG. 2, $V_{2B+}$ is the voltage of the fourth Wheatstone bridge 150b that corresponds to the Vb+ reference point 160 of the second Wheatstone bridge 150 with reference to FIG. 2, $V_{2B-}$ is the voltage of the fourth Wheatstone bridge 150b that corresponds to the Vb− reference point 162 of the second Wheatstone bridge 150 with reference to FIG. 2, and θ is a constant angular offset described below. The proportionality relationship indicated in EQ 1 and EQ 2 generalizes the relationship, providing that $V_A$ and $V_B$ may be scaled by off-die signal conditioning and/or amplification by the optional AFE 103. Likewise, the constant angular offset θ is provided to accommodate a constant angle offset between the electrical output and the mechanical angle reference point. A first magnetic field generated by the magnet 110 is incident on the first AMR angular sensor (i.e., the first Wheatstone bridge 132a and the second Wheatstone bridge 150a), and a second magnetic field generated by the magnet 110 is incident on the second AMR angular sensor (i.e., the third Wheatstone bridge 132b and the fourth Wheatstone bridge 150b), where the first magnetic field and the second magnetic field are in-plane and orthogonal to each other.

Figure 6:
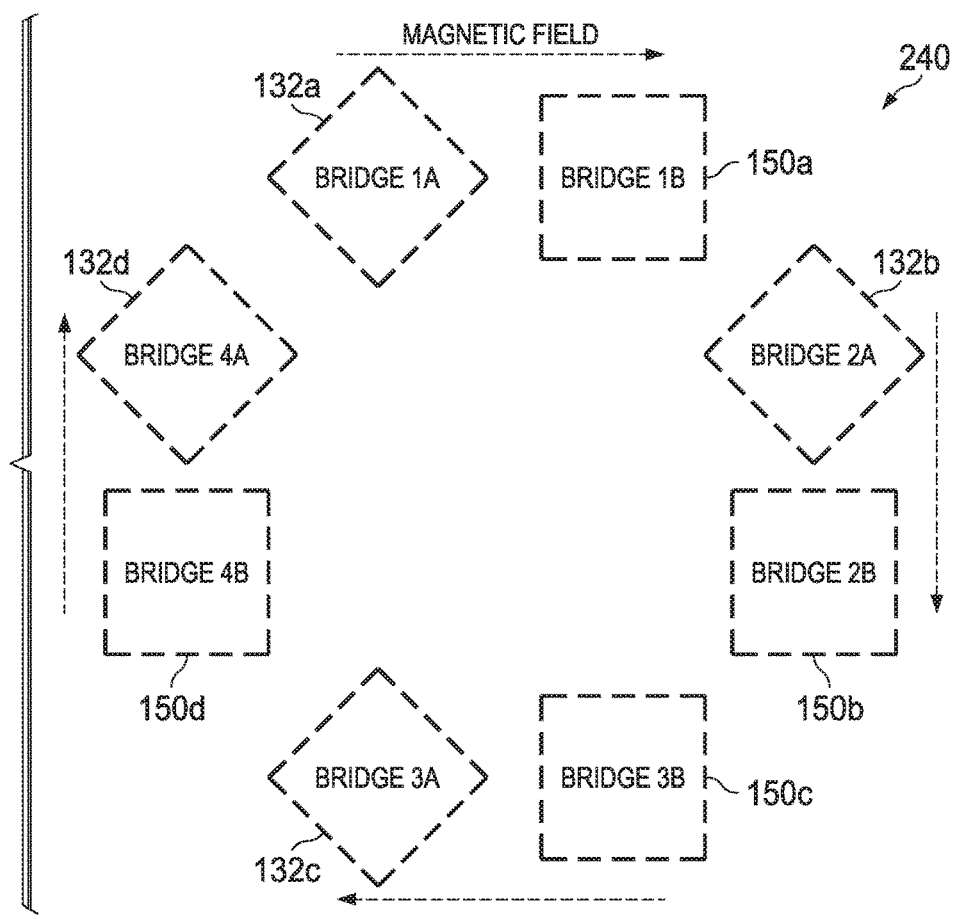
FIG. 6 is an electrical schematic of four AMR angle sensors exposed to four magnetic fields according to an embodiment of the disclosure.

Turning now to FIG. 6, an illustrative AMR sensor array 240 is described. The AMR sensor array 240 comprises four separate AMR angle sensors. A first AMR angle sensor comprises a first Wheatstone bridge 132a and a second Wheatstone bridge 150a, a second AMR angle sensor comprises a third Wheatstone bridge 132b and a fourth Wheatstone bridge 150b, a third AMR angle sensor comprises a fifth Wheatstone bridge 132c and a sixth Wheatstone bridge 150c, and a fourth AMR angle sensor comprises a seventh Wheatstone bridge 132d and an eighth Wheatstone bridge 150d. Each of the four AMR angle sensors may be implemented in a structure like that of the octagonal disposition of serpentine resistors 200 described above with reference to FIG. 4. The resistors of the Wheatstone bridges of each of the AMR angle sensors may be connected to establish the circuit 130 of FIG. 2 as described above.

The angular displacement a 108, with reference to FIG. 1, can be found as $$V_{1A} = (V_{1A+} - V_{1A-})  \quad \text{EQ 4}$$

$$V_{2A} = (V_{2A+} - V_{2A-})  \quad \text{EQ 5}$$

$$V_{3A} = (V_{3A+} - V_{3A-})  \quad \text{EQ 6}$$

$$V_{4A} = (V_{4A+} - V_{4A-})  \quad \text{EQ 7}$$

$$V_A \propto V_{1A} - V_{2A} + V_{3A} - V_{4A}  \quad \text{EQ 8}$$

$$V_{1B} = (V_{1B+} - V_{1B-})  \quad \text{EQ 9}$$

$$V_{2B} = (V_{2B+} - V_{2B-})  \quad \text{EQ 10}$$

$$V_{3B} = (V_{3B+} - V_{3B-})  \quad \text{EQ 11}$$

-continued $$V_{4B} = (V_{4B+} - V_{4B-})  \quad \text{EQ 12}$$

$$V_B \propto V_{1B} - V_{2B} + V_{3B} - V_{4B}  \quad \text{EQ 13}$$

$$\alpha = \frac{1}{2}\tan^{-1}\left(\frac{V_A}{V_B}\right) + \theta  \quad \text{EQ 14}$$

where the VnA+ represents the voltage of the n-th AMR sensor corresponding to the Va+ reference point 142 of the first Wheatstone bridge 132 in FIG. 2, the VnA− represents the voltage of the n-th AMR sensor corresponding to the voltage of the Va− reference point 144 of the first Wheatstone bridge 132 in FIG. 2, the VnB+ represents the voltage of the n-th AMR sensor corresponding to the voltage of the Vb+ reference point 160 of the second Wheatstone bridge 150 of FIG. 2, and the VnB− represents the voltage of the n-th AMR sensor corresponding to the voltage of the Vb− reference point 162 of the second Wheatstone bridge 150 of FIG. 2. As above, the proportionality relationship identified in EQ 8 and EQ 13 provide for scaling of the voltages by the optional AFE 103, for example scaling and/or signal conditioning, and the constant angular offset θ is provided to accommodate a constant angle offset between the electrical output and the mechanical angle reference point.

A first magnetic field generated by the magnet 110 is incident on the first AMR angular sensor (i.e., the first Wheatstone bridge 132a and the second Wheatstone bridge 150a). A second magnetic field generated by the magnet 110 is incident on the second AMR angular sensor (i.e., the third Wheatstone bridge 132b and the fourth Wheatstone bridge 150b). A third magnetic field generated by the magnet 110 is incident on the third AMR angular sensor (i.e., the fifth Wheatstone bridge 132c and the sixth Wheatstone bridge 150c). A fourth magnetic field generated by the magnet 110 is incident on the fourth AMR angular sensor (i.e., the seventh Wheatstone bridge 132d and the eighth Wheatstone bridge 150d). Each of the four magnetic fields are in-plane with each other and orthogonal to the other fields.

Figure 7:
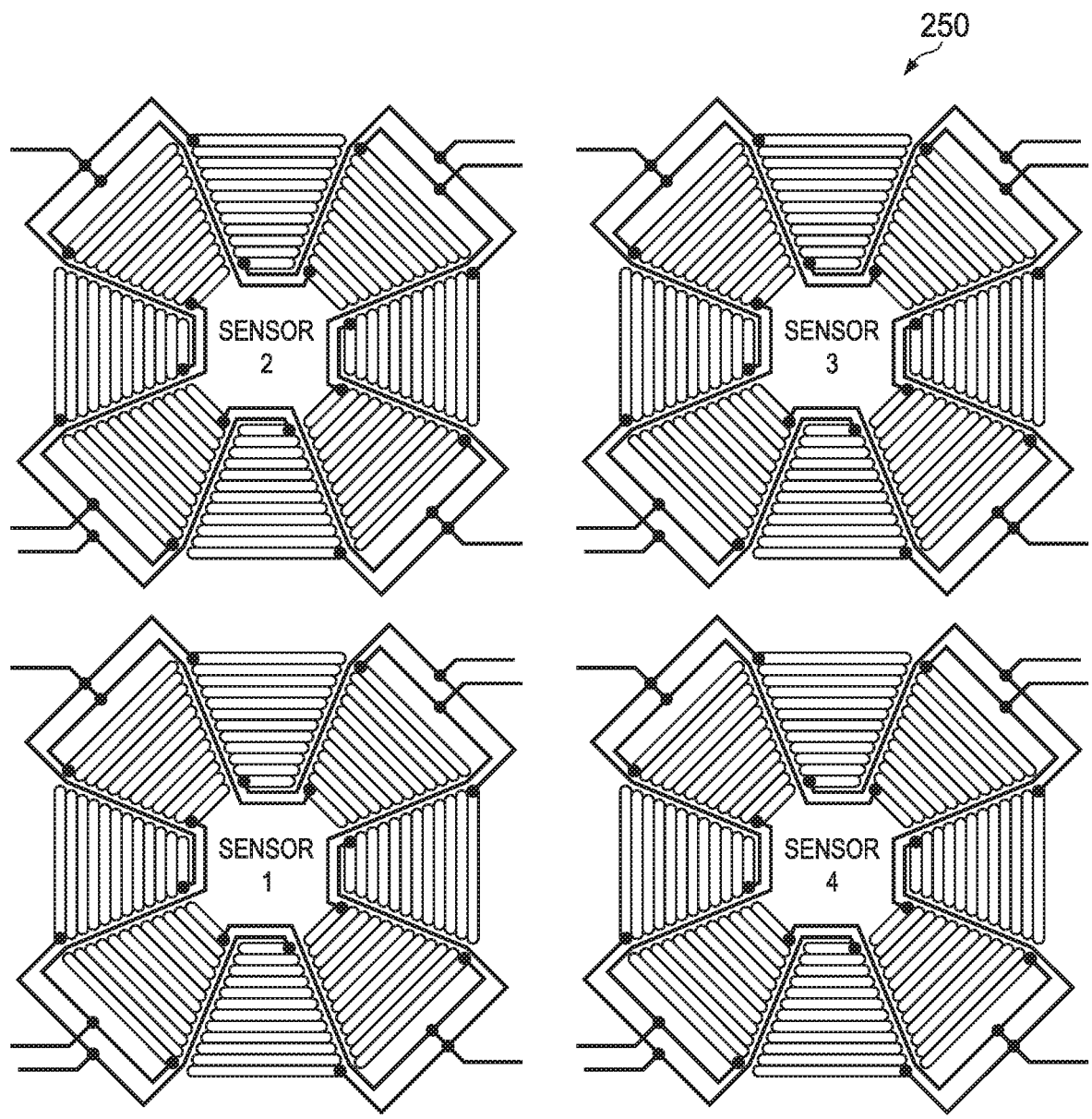
FIG. 7 is a top view illustrating an AMR sensor array die according to an embodiment of the disclosure.

Turning now to FIG. 7, an illustration of an AMR sensor array die 250 is described. The AMR sensor array die 250 features the four AMR angle sensors described above with reference to FIG. 6. Each of the four AMR angle sensors has 6 electrical contact points. The four AMR angle sensors may be formed on a single semiconductor substrate and the electrical interconnections between the AMR sensors (not shown) would be formed as part of the semiconductor manufacturing process. Alternatively, each of the four AMR angle sensors may be manufactured on a separate semiconductor die and the electrical interconnections between the AMR sensors (not shown) would be provided by another structure such as a socket that mated with the four AMR angle sensor dies or by an AFE 103.

Figure 8:
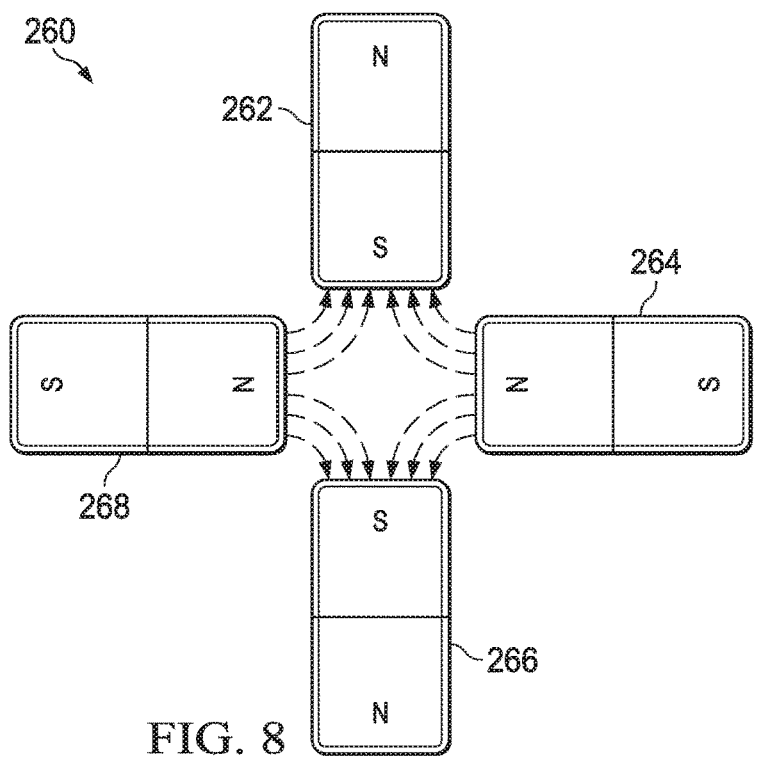
FIG. 8 is a top view illustrating magnets generating four in-plane orthogonal magnetic fields according to an embodiment of the disclosure.

Turning now to FIG. 8, an illustrative magnet array 260 able to generate four in-plane orthogonal magnetic fields is illustrated. The magnet array 260 comprises a first magnet 262, a second magnet 264, a third magnet 266, and a fourth magnet 268. The south pole of the first magnet 262 is directed downward, and the south pole of the third magnet 266 is directed upward and toward the south pole of the first magnet 262. The north pole of the second magnet 264 is directed leftward, the north pole of the fourth magnet 268 is directed rightward and toward the north pole of the second magnet 264.

Figure 9:
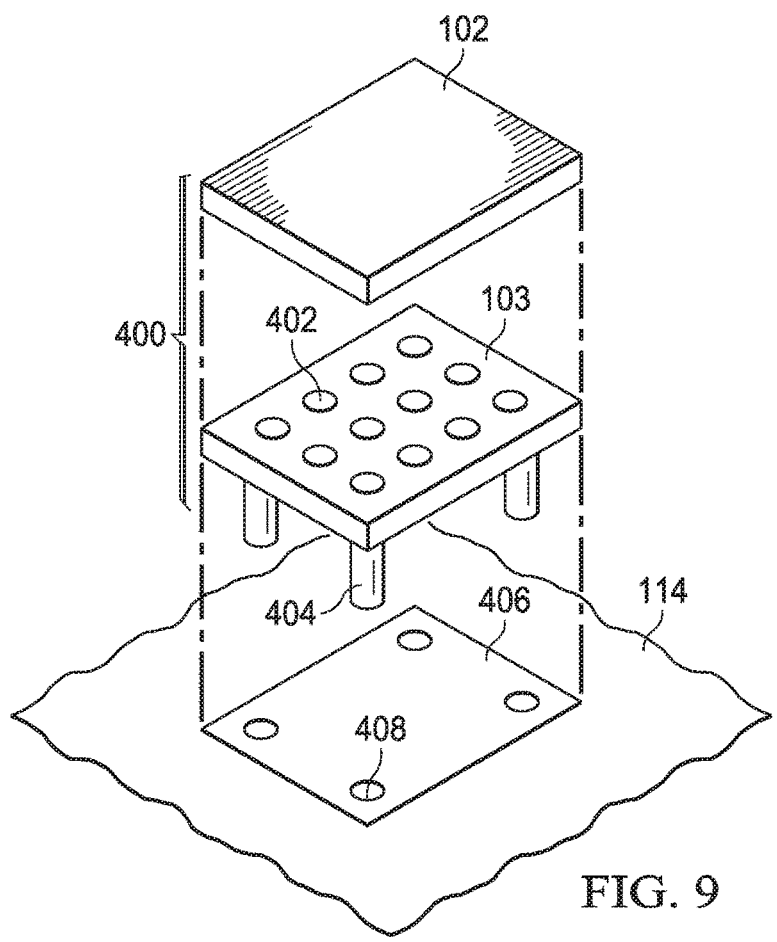
FIG. 9 is a three-dimensional view illustrating an anisotropic magneto-resistive (AMR) sensor die and an analog front end (AFE) according to an embodiment of the disclosure.

Turning now to FIG. 9, an illustrative AMR angle sensor array package 400 is described. In an embodiment, an anisotropic magneto-resistive (AMR) angle sensor array 102 (e.g., AMR sensor 250) is electrically connected to an analog front end (AFE) 103 to form the AMR angle sensor array package 400. While the sensor array 102 is illustrated in FIG. 9 as a single die, in an embodiment the sensor array 102 may be composed of a plurality of dies (one AMR angle sensor per die or two AMR angle sensors per die) that are electrically connected to the analog front end 103. For example, an array of two AMR angle sensors may be composed from a first die having a single AMR angle sensor and a second die having a single AMR angle sensor. For example, an array of four AMR angle sensors may be composed from a first die having a single AMR angle sensor, a second die having a single AMR angle sensor, a third die having a single AMR angle sensor, and a fourth die having a single AMR angle sensor. Alternatively, an array of four AMR angle sensors may be composed from a first die having two AMR angle sensors and a second die having two AMR angle sensors.

The AFE 103 may provide a plurality of electrical contacts 402 to electrically connect to the AMR angle sensor array 102, for example using solder balls or another connection technology. The AFE 103 may provide a plurality of jacks 404 to connect to a plurality of sockets 408 of a connector 406 mounted on the fixed structure 114. The sockets 408 may provide power and ground to the AFE 103, and the AFE 103 may provide conditioned power to the AMR angle sensor array 102. The AFE 103 may receive signal outputs from the AMR angle sensor array 102, for example angle signal outputs. The AFE 103 may buffer these signal outputs, for example conditioning the signal outputs with one or more operational amplifiers to make the outputs more robust. The AFE 103 may amplify and/or signal shift the outputs. The AFE 103 may modulate the outputs onto a carrier signal to transit the angle indication, possibly to make the angle indication more robust in the presence of noise. The AFE 103 may combine or derive an indication that simplifies the outputs, for example generating a $\sin(\alpha)$ analog output and a $\cos(\alpha)$ analog output from the outputs. The AMR angle sensor array 102 and the AFE 103 may be enclosed in a package (not shown) so the AMR angle sensor array package 400 may be sold and/or delivered for use as an assembled unit. In an embodiment, the AMR angle sensor array 102 may have a planar area less than 2 mm×2 mm; an area less than 1.6 mm×1.6 mm; or an area less than 1.2 mm×1.2 mm. In an embodiment, the AMR angle sensor array 102 may not be square but may be rectangular in planar shape.

Figure 10A:
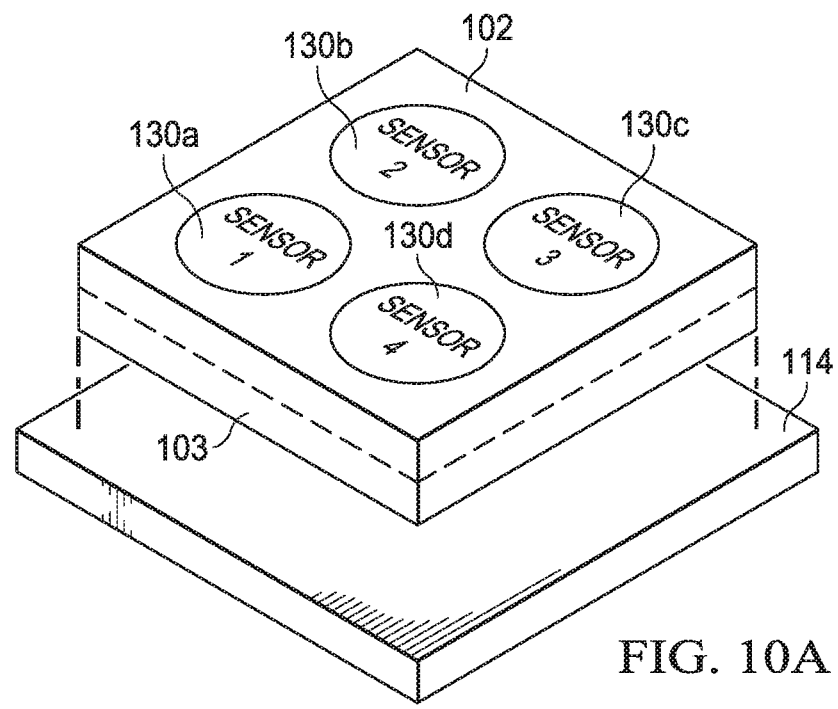
FIG. 10A is a three-dimensional view illustrating a first physical alignment of an AMR sensor array die, an analog front end (AFE), and a fixed structure according to an embodiment of the disclosure.
Figure 10B:
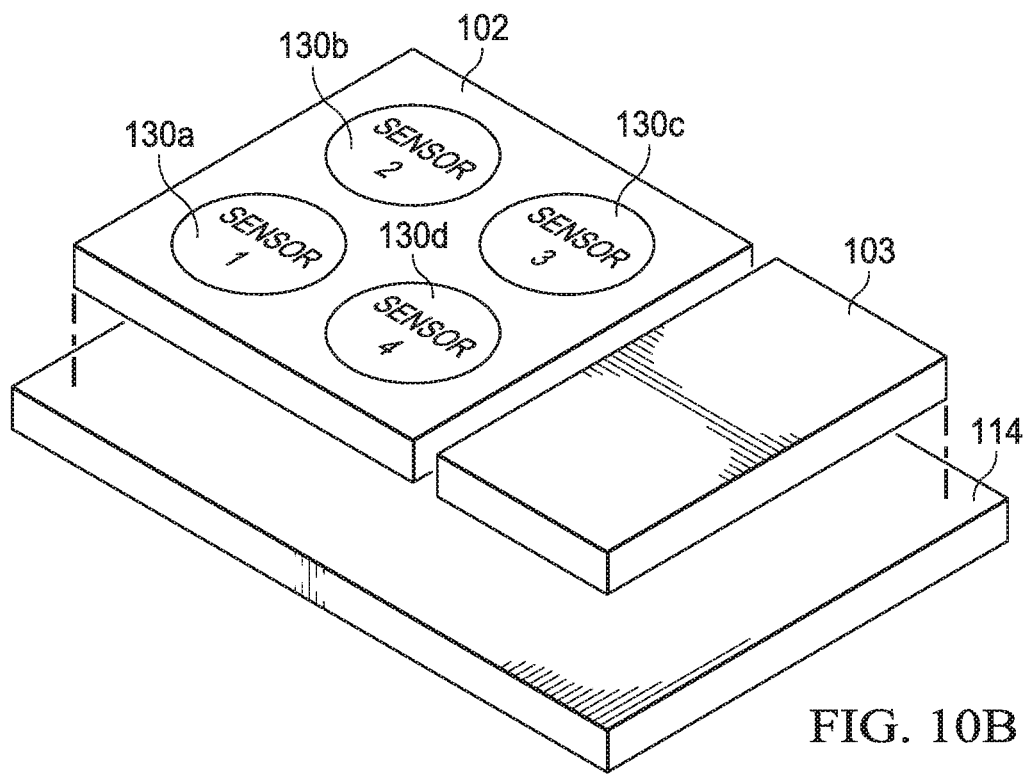
FIG. 10B is a three-dimensional view illustrating a second physical alignment of an AMR sensor array die, an analog front end (AFE), and a fixed structure according to an embodiment of the disclosure.
Figure 10C:
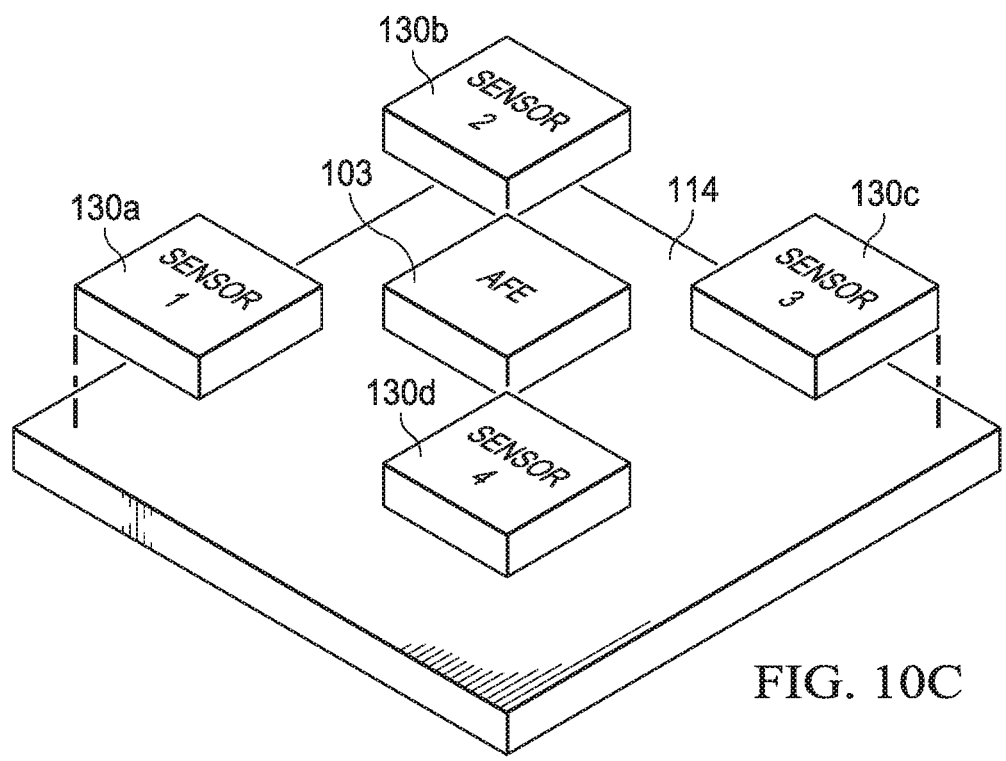
FIG. 10C is a three-dimensional view illustrating a physical alignment of a four AMR sensor array dies, an analog front end (AFE), and a fixed structure according to an embodiment of the disclosure.

Turning now to FIG. 10A, FIG. 10B, and FIG. 10C, some alternative packaging embodiments are described. In FIG. 10A, the sensor die 102 is illustrated as comprising four AMR angle sensors, the sensor die 102 is electrically coupled to the AFE 103, and the AFE 103 is electrically coupled to the fixed structure 114. In FIG. 10B, the sensor die 102 is located adjacent to the AFE 103, and the sensor die 102 is mechanically coupled to the fixed structure 114. The sensor die 102 is electrically coupled to the AFE 103, and the AFE 103 is electrically coupled to the fixed structure 114. In FIG. 10C, four circuits 130 (e.g., AMR angle sensors) are provided as separate dies. The circuits 130a, 130b, 130c, 130d are each mechanically coupled to the fixed structure 114 and are electrically coupled to the AFE 103. The AFE is electrically coupled to the fixed structure 114.

While several embodiments have been provided in the present disclosure, the disclosed systems and methods may be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted or not implemented.

Techniques, systems, subsystems, and methods described and illustrated in the various embodiments as discrete or separate may be combined or integrated with other systems, modules, techniques, or methods without departing from the scope of the present disclosure. Other items shown or discussed as directly coupled or communicating with each other may be indirectly coupled or communicating through some interface, device, or intermediate component, whether electrically, mechanically, or otherwise. Other examples of changes, substitutions, and alterations are ascertainable by one skilled in the art and could be made without departing from the spirit and scope disclosed herein.

What is claimed is:

1. An anisotropic magneto-resistive (AMR) angle sensor die, comprising:
   a plurality of AMR angle sensors coupled to each other in series, each of the plurality of AMR angle sensors comprising a first Wheatstone bridge and a second Wheatstone bridge, wherein an angle position output of the sensor die includes a combination of angle position outputs of each of the plurality of AMR angle sensors.

2. The AMR angle sensor die of claim 1, further comprising:
   a first AMR angle sensor that comprises a first Wheatstone bridge comprising a first serpentine resistor, a second serpentine resistor, a third serpentine resistor, and a fourth serpentine resistor and a second Wheatstone bridge that comprises a fifth serpentine resistor, a sixth serpentine resistor, a seventh serpentine resistor, and an eighth serpentine resistor, and
   a second AMR angle sensor that comprises a third Wheatstone bridge comprising a ninth serpentine resistor, a tenth serpentine resistor, an eleventh serpentine resistor, and a twelfth serpentine resistor and a fourth Wheatstone bridge comprising a thirteenth serpentine resistor, a fourteenth serpentine resistor, a fifteenth serpentine resistor, and a sixteenth serpentine resistor.

3. The AMR angle sensor die of claim 2, wherein:
   each of the serpentine resistors defines a substantially trapezoidal polygon disposed in substantially a same plane as the other serpentine resistors,
   the first through eighth serpentine resistors are disposed to define a substantially regular first octagonal polygon, where the fifth serpentine resistor is located between the first serpentine resistor and the second serpentine resistor, the sixth serpentine resistor is located between the second serpentine resistor and the third serpentine resistor, the seventh serpentine resistor is located between the third and the fourth serpentine resistor, and the eighth serpentine resistor is located between the fourth serpentine resistor and the first serpentine resistor, and
   the ninth through sixteenth serpentine resistors are disposed to define a substantially regular second octagonal polygon, where the thirteenth serpentine resistor is located between the ninth serpentine resistor and the tenth serpentine resistor, the fourteenth serpentine resistor is located between the tenth serpentine resistor and the eleventh serpentine resistor, the fifteenth serpentine resistor is located between the eleventh and the twelfth serpentine resistor, and the sixteenth serpentine resistor is located between the twelfth serpentine resistor and the ninth serpentine resistor.

4. The AMR angle sensor die of claim 2, further comprising:
a third AMR angle sensor that comprises a fifth Wheatstone bridge comprising a seventeenth serpentine resistor, an eighteenth serpentine resistor, a nineteenth serpentine resistor, and a twentieth serpentine resistor and a sixth Wheatstone bridge that comprises a twenty-first serpentine resistor, a twenty-second serpentine resistor, a twenty-third serpentine resistor, and a twenty-fourth serpentine resistor, and
a fourth AMR angle sensor that comprises a seventh Wheatstone bridge comprising a twenty-fifth serpentine resistor, a twenty-sixth serpentine resistor, a twenty-seventh serpentine resistor, and a twenty-eighth serpentine resistor and an eighth Wheatstone bridge comprising a twenty-ninth serpentine resistor, a thirtieth serpentine resistor, a thirty-first serpentine resistor, and a thirty-second serpentine resistor.

5. The AMR angle sensor die of claim 1, wherein the first Wheatstone bridge of each of the plurality of AMR angle sensors comprises four serpentine resistors and the second Wheatstone bridge of each of the AMR angle sensors comprises four other serpentine resistors, where the serpentine resistors of the first and second Wheatstone bridge comprise anisotropic magneto-resistive material.

6. The AMR angle sensor die of claim 5, wherein the anisotropic magneto-resistive material comprises nickel and iron.

7. The AMR angle sensor die of claim 1, wherein the die has a planar area of less than 1.2 mm×1.2 mm.

8. An anisotropic magneto-resistive (AMR) angle sensor package, comprising:
a sensor die comprising a plurality of AMR angle sensors coupled to each other in series, each of the plurality of AMR angle sensors comprising a first Wheatstone bridge and a second Wheatstone bridge disposed in a same plane and disposed in an octagonal pattern, wherein an angle position output of the sensor die includes a combination of angle position outputs of each of the AMR angle sensors.

9. The AMR angle sensor package of claim 8, further comprising an analog front end (AFE) electrically coupled to the sensor die that is configured to provide electrical power and ground to each of the plurality of AMR angle sensors and provides signal conditioning to the angle position output of the sensor die.

10. The AMR sensor package of claim 9, wherein the sensor die comprises:
a first AMR angle sensor that comprises a first Wheatstone bridge comprising a first serpentine resistor, a second serpentine resistor, a third serpentine resistor, and a fourth serpentine resistor and a second Wheatstone bridge that comprises a fifth serpentine resistor, a sixth serpentine resistor, a seventh serpentine resistor, and an eighth serpentine resistor, and
a second AMR angle sensor that comprises a third Wheatstone bridge comprising a ninth serpentine resistor, a tenth serpentine resistor, an eleventh serpentine resistor, and a twelfth serpentine resistor and a fourth Wheatstone bridge comprising a thirteenth serpentine resistor, a fourteenth serpentine resistor, a fifteenth serpentine resistor, and a sixteenth serpentine resistor.

11. The AMR angle sensor package of claim 10, wherein a first angle position output of the sensor die is the sum of a voltage across the first Wheatstone bridge and a voltage across the third Wheatstone bridge and a second angle position output of the sensor die is the sum of a voltage across the second Wheatstone bridge and a voltage across the fourth Wheatstone bridge.

12. The AMR angle sensor package of claim 11, wherein an angular position α indicated by the AMR angle sensor package is determined based on $$\alpha = \tan^{-1}\left(\frac{V_A}{V_B}\right) + \theta$$

where $V_A$ is proportional to the sum of the voltages across the first and third Wheatstone bridges, $V_B$ is proportional to the sum of the voltages across the second and fourth Wheatstone bridges, and θ is a constant angle.

13. The AMR sensor package of claim 10 wherein the sensor die further comprises:
a third AMR angle sensor that comprises a fifth Wheatstone bridge comprising a seventeenth serpentine resistor, an eighteenth serpentine resistor, a nineteenth serpentine resistor, and a twentieth serpentine resistor and a sixth Wheatstone bridge that comprises a twenty-first serpentine resistor, a twenty-second serpentine resistor, a twenty-third serpentine resistor, and a twenty-fourth serpentine resistor, and
a fourth AMR angle sensor that comprises a seventh Wheatstone bridge comprising a twenty-fifth serpentine resistor, a twenty-sixth serpentine resistor, a twenty-seventh serpentine resistor, and a twenty-eighth serpentine resistor and an eighth Wheatstone bridge comprising a twenty-ninth serpentine resistor, a thirtieth serpentine resistor, a thirty-first serpentine resistor, and a thirty-second serpentine resistor.

14. The AMR angle sensor package of claim 13, wherein a first angle position output of the sensor die is the sum of a voltage across the first Wheatstone bridge, a voltage across the fifth Wheatstone bridge, a negative of the voltage across the third Wheatstone bridge, and a negative of the voltage across the seventh Wheatstone bridge and a second angle position output of the sensor die is the sum of a voltage across the second Wheatstone bridge, a voltage across the sixth Wheatstone bridge, a negative of the voltage across the fourth Wheatstone bridge, and a negative of the voltage across the eighth Wheatstone bridge.

15. The AMR angle sensor package of claim 14, wherein an angular position α indicated by the AMR angle sensor package is determined based on $$\alpha = \tan^{-1}\left(\frac{V_A}{V_B}\right) + \theta$$

where $V_A$ is proportional to the sum of a voltage across the first Wheatstone bridge, a voltage across the fifth Wheatstone bridge, a negative of the voltage across the third Wheatstone bridge, and a negative of the voltage across the seventh Wheatstone bridge, $V_B$ is proportional to the sum of a voltage across the second Wheatstone bridge, a voltage across the sixth Wheatstone bridge, a negative of the voltage across the fourth Wheatstone bridge, and a negative of the voltage across the eighth Wheatstone bridge, and θ is a constant angle.

16. An anisotropic magneto-resistive (AMR) angle sensor package, comprising:

a sensor die comprising four AMR angle sensors coupled to each other in series, wherein each of the four AMR angle sensors comprises a first Wheatstone bridge and a second Wheatstone bridge, wherein an angle position output of the sensor die is a combination of angle position outputs of each of the four AMR angle sensors; and an analog front end (AFE) electrically coupled to the sensor die that is configured to provide electrical power and ground to each of the four AMR angle sensors and to provide signal conditioning to the angle position output of the sensor die.

17. The AMR angle sensor package of claim 16, wherein the sensor die comprises:
   a first AMR angle sensor that comprises a first Wheatstone bridge comprising a first serpentine resistor, a second serpentine resistor, a third serpentine resistor, and a fourth serpentine resistor and a second Wheatstone bridge that comprises a fifth serpentine resistor, a sixth serpentine resistor, a seventh serpentine resistor, and an eighth serpentine resistor,
   a second AMR angle sensor that comprises a third Wheatstone bridge comprising a ninth serpentine resistor, a tenth serpentine resistor, an eleventh serpentine resistor, and a twelfth serpentine resistor and a fourth Wheatstone bridge comprising a thirteenth serpentine resistor, a fourteenth serpentine resistor, a fifteenth serpentine resistor, and a sixteenth serpentine resistor,
   a third AMR angle sensor that comprises a fifth Wheatstone bridge comprising a seventeenth serpentine resistor, an eighteenth serpentine resistor, a nineteenth serpentine resistor, and a twentieth serpentine resistor and a sixth Wheatstone bridge that comprises a twenty-first serpentine resistor, a twenty-second serpentine resistor, a twenty-third serpentine resistor, and a twenty-fourth serpentine resistor, and
   a fourth AMR angle sensor that comprises a seventh Wheatstone bridge comprising a twenty-fifth serpentine resistor, a twenty-sixth serpentine resistor, a twenty-seventh serpentine resistor, and a twenty-eighth serpentine resistor and an eighth Wheatstone bridge comprising a twenty-ninth serpentine resistor, a thirtieth serpentine resistor, a thirty-first serpentine resistor, and a thirty-second serpentine resistor.

18. The AMR angle sensor package of claim 17, wherein the serpentine resistors comprise anisotropic magneto-resistive material.

19. The AMR angle sensor package of claim 18, wherein the anisotropic magneto-resistive material comprises nickel and iron.

20. The AMR angle sensor package of claim 16, wherein the sensor die has a planar area of less than 1.2 mm×1.2 mm.

* * * * *